United States Patent
Hermann

(10) Patent No.: US 7,595,670 B2
(45) Date of Patent: Sep. 29, 2009

(54) ELECTRONIC DEVICE AND METHOD FOR ON CHIP SKEW MEASUREMENT

(75) Inventor: Franz Hermann, Fahrenzhausen (DE)

(73) Assignee: Texas Instruments Deutschland GmbH, Freising (DE)

(*) Notice: Subject to any disclaimer, the term of this patent is extended or adjusted under 35 U.S.C. 154(b) by 0 days.

(21) Appl. No.: 12/137,354

(22) Filed: Jun. 11, 2008

(65) Prior Publication Data

US 2008/0309385 A1 Dec. 18, 2008

Related U.S. Application Data

(60) Provisional application No. 61/016,693, filed on Dec. 26, 2007.

(30) Foreign Application Priority Data

Jun. 12, 2007 (DE) ............... 10 2007 027 069

(51) Int. Cl.
 *H03L 7/06* (2006.01)
(52) U.S. Cl. .................... 327/147; 327/163
(58) Field of Classification Search ............... None
See application file for complete search history.

(56) References Cited

U.S. PATENT DOCUMENTS

| 5,003,256 | A | | 3/1991 | Merrill |
| 6,002,279 | A | * | 12/1999 | Evans et al. ............ 327/144 |
| 6,208,169 | B1 | | 3/2001 | Wong et al. |
| 6,963,229 | B2 | * | 11/2005 | Lin .................... 327/33 |

(Continued)

FOREIGN PATENT DOCUMENTS

EP 0889411 A2 7/1999

OTHER PUBLICATIONS

Marc Wernert, authorized officer, International Searching Authority, Notification of Transmittal of the International Search Report and the Written Opinion of the International Searching Authority, or the Declaration, date of mailing Oct. 9, 2008, International Application No. PCT/EP2008/057361, International Filing Date Dec. 6, 2008.

*Primary Examiner*—Cassandra Cox
(74) *Attorney, Agent, or Firm*—John J. Patti; Wade J. Brady, III; Frederick J. Telecky, Jr.

(57) ABSTRACT

The invention relates to an integrated electronic device for digital signal processing, which includes a phase locked loop for generating an output clock signal based on a reference clock input signal, multiple outputs for providing multiple representatives of the output clock signal, a stage for generating a phase shifted output clock signal having multiple phases spanning one clock period of the output clock signal, a register having multiple units each coupled by a data input to a representative of the output clock signal, and to the phase shifted output clock signal for storing single bit values in response to an edge of the shifted output clock signal, wherein the stage for generating the phase shifted output clock is controlled to selectively shift the phase of the output clock and circuitry for reading out the stored single bit values from the register is provided in order to determine the output skew of the output clock signals based on the read out single bit value.

4 Claims, 1 Drawing Sheet

U.S. PATENT DOCUMENTS

| | | | |
|---|---|---|---|
| 7,123,678 B2 * | 10/2006 | Hendrickson | 375/376 |
| 7,236,552 B2 * | 6/2007 | Robertson et al. | 375/354 |
| 7,323,917 B2 * | 1/2008 | Cho et al. | 327/158 |
| 7,402,821 B2 * | 7/2008 | Bernhardt | 250/492.21 |
| 7,417,510 B2 * | 8/2008 | Huang | 331/74 |
| 2004/0128591 A1 | 7/2004 | Ihs et al. | |
| 2004/0223571 A1 | 11/2004 | Donnelly et al. | |
| 2005/0024037 A1 | 2/2005 | Fetzer | |
| 2005/0084048 A1 * | 4/2005 | Wu | 375/355 |
| 2007/0063687 A1 * | 3/2007 | Zhou et al. | 323/315 |

* cited by examiner

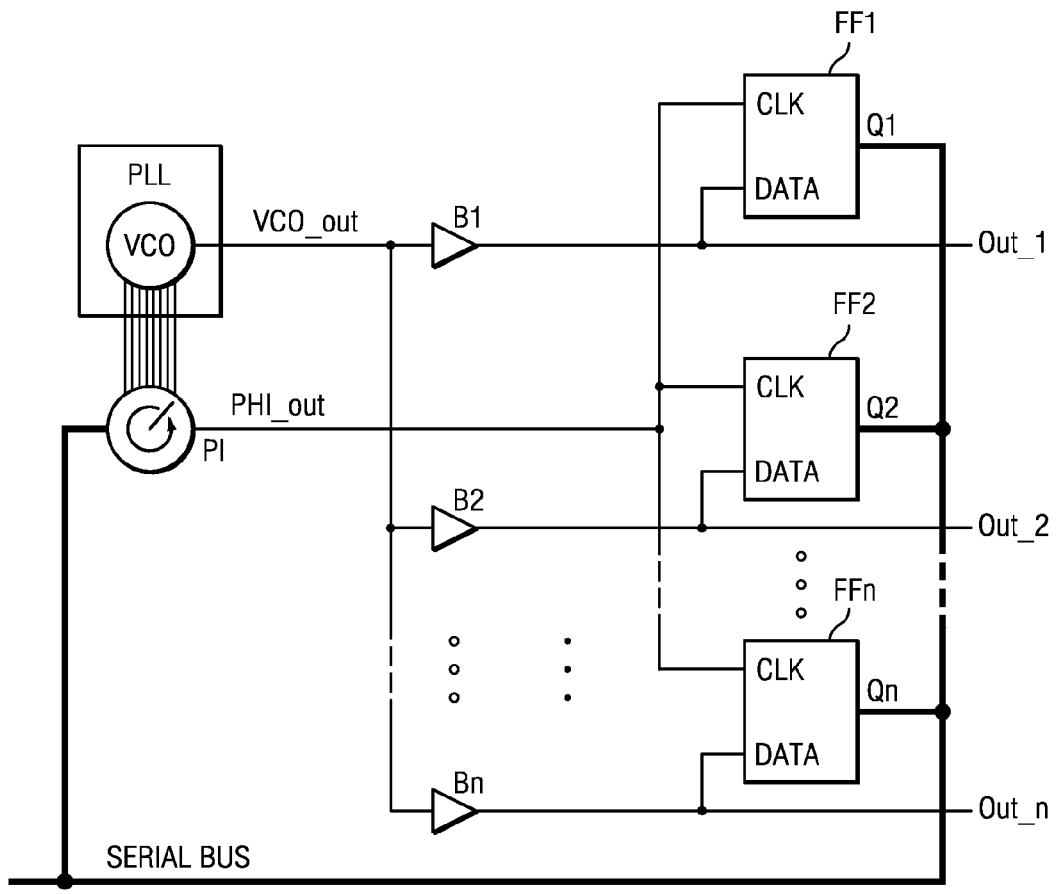

ELECTRONIC DEVICE AND METHOD FOR ON CHIP SKEW MEASUREMENT

This patent application claims priority from German Patent Application No. 10 2007 027 069.2, filed 12 Jun. 2007, and from U.S. Provisional Patent Application No. 61/016,693, filed 26 Dec. 2007, the entireties of which are incorporated herein by reference.

FIELD OF THE INVENTION

The invention generally relates to an integrated electronic device for digital signal processing. More particularly, the invention relates to measurement of output skew in a clock signal output from an electronic device.

BACKGROUND

In clocks or clock-based integrated electronic devices, multiple representatives of the same clock or data signal are often derived from the same source signal. Although the buffers and interconnections used for this purpose are designed with great care, there is often a variation between the same rising or falling edges of the multiple representations of the same clock or data signal. The time shift or offset between the signals is known as skew. The amount of skew is typically measured by an external automatic test equipment (ATE).

To measure skew on automatic test equipment, the ATE has to provide a precision time measurement system or a repeatable signal edge placement. Generally, all time measurement units that can measure time delays can also measure output skew. The accuracy of the measurement depends on the repeatability and precision of the time measurement unit. It is also possible to measure output skew by analyzing edge placement results. The accuracy in this case depends on the edge placement resolution and on the edge placement repeatability. However, the time measurement system on the ATE is sometimes not accurate enough to measure output skew in the low ps range. Furthermore, often there is no time measurement system available at all on the ATE. If there is a time measurement system, it must often be shared between sites during multi-site testing, which makes multi-site testing extremely difficult. On some ATE test systems it is also not possible to control edge placement timing precisely and the accuracy of edge placement is not accurate enough for output skew measurement. When systems do have an accurate time measurement system or an accurate edge placement, they are usually very expensive. Further, it is difficult to design a test load board for output skew measurement. This is because the specified load for the device is often not the same as the impedance of the measurement system, which can have a negative influence on the measurement results. Also, the lines of the signal channels where the output skew should be measured must have exactly the same length and variations in board manufacturing negatively influence the output skew results.

SUMMARY

It is an object of the invention to provide integrated electronic device for digital signal processing that allows output skew to be measured accurately and can be used for multi-site testing. It is also an object of the invention to provide an inexpensive test system with a more simple layout that achieves matched line length in the ps range.

In one aspect, the invention provides an integrated electronic device for digital signal processing. The device comprises a phase locked loop for generating an output clock signal based on a reference clock input signal, multiple outputs for providing multiple representatives of the output clock signal and a stage for generating a phase shifted output clock signal having multiple phases spanning one clock period of the output clock signal.

A described embodiment has a register with multiple units each coupled by a data input to a representation of the output clock signal, and to the phase shifted output clock signal for storing single bit values in response to an edge of the shifted output clock signal. The stage for generating the phase shifted output clock is controlled to selectively shift the phase of the output clock and circuitry is provided for reading the stored single bit values out from the register in order to determine the output skew of the output clock signals based on the read out single bit values.

The phase of the shifted output clock signal can be shifted in small steps from 0° to 360° using, for example, a phase interpolator serving as a stage for generating the phase shifted output clock. The signal from the phase interpolator is then used as a clock signal for the register to capture the data to the register on each of the multiple clock signal outputs at the same time. For each phase interpolator step from 0° to 360°, the output data is captured with the phase interpolator signal used as a clock. After capturing the output data, the data is stored, either in an on-chip memory or externally in an ATE, and the phase interpolator is stepped one step forward. The phase interpolator control and data store can be performed via a serial bus or via data control logic on the chip. The stored bit pattern is then a result of the output skew of the clock signals output from the circuit. The bit pattern can either be evaluated on chip, or the bit pattern can be transferred to an external device via a specific bus. If evaluation is performed on chip, the final skew results can be transmitted, which reduces data traffic. Reading out the data from the register, can preferably be done by serial bus, which is coupled to the each unit of the register. The register may consist of a row of flip-flops having the serial bus coupled to each data output of the flip-flops. In this way, the output skew can be determined on the chip without external measurements, which removes the need for an expensive ATE system for measuring the output skew. Further, the on chip measurement can provide higher precision with less effort and complexity than external equipment, in particular for multi-site measurements.

In another aspect, the invention provides a method for determining a skew of multiple output clock signals. In a described embodiment, the method comprises generating an output clock signal based on a reference clock input signal by a phase locked loop, generating multiple representations of the output clock signal, generating a phase shifted output clock signal having multiple phases spanning one clock period of the output clock signal and storing the state of each representation of the output clock signal values in response to an edge of the shifted output clock signal, and reading out the stored single bit values in order to determine the output skew of the representations of the output clock signal.

Thus, the invention provides the advantage of a digital on-chip measurement solution which is more accurate than existing ATEs, has a simplified test board layout and fabrication, can be used for multi-site testing, and is cheap without loss of skew test capability.

BRIEF DESCRIPTION OF THE DRAWINGS

Further advantages and characteristics of the invention will become apparent from the following detailed description of example embodiments, with reference to accompanying drawings, wherein:

FIG. 1 is a simplified schematic of an integrated electronic device for digital signal processing according to the invention.

DETAILED DESCRIPTION OF EXAMPLE EMBODIMENTS

FIG. 1 shows an integrated electronic device according to the invention. A phase-locked loop circuit comprising a voltage controlled oscillator (VCO) is provided on a chip and has one output that is branched to each of n outputs Out_1-Out_n of the chip via buffers B1-Bn, respectively. The phase locked loop is operable to generate an output clock signal VCO_out based on a reference clock input signal and the multiple outputs Out_1-Out_n provide multiple representations of the output clock signal VCO_out. A further output of the phase locked loop (the output of the VCO) is coupled to a phase interpolator PI. The VCO has a minimum of two fixed output phases output to the phase interpolator PI. In the illustrated example, eight fixed output phases are shown schematically. The phase interpolator PI is operable to generate a phase shifted output clock signal PHI_out having multiple phases spanning one clock period of the output clock signal.

The output of the phase interpolator PI is coupled to a register comprising n flip-flops FF1-FFn, where n is the number of chip outputs. The output of the phase interpolator PI is connected to the clk input of each flip-flop FF1-FFn and the branched output VCO_out of the VCO is also connected to the data input of each flip flop FF1-FFn, as well as to the corresponding chip output Out_1-Out_n. Therefore, the register has multiple units, flip-flops FF1-FFn, each having a DATA input coupled to a representation of the output signal VCO_out and a CLK input coupled to the shifted output clock signal PHI_out. The flip-flops FF1-FFn are operable to store single bit values in response to an edge of the shifted output clock signal PHI_out. A serial bus is coupled to the outputs Q1-Qn of each flip-flop FF1-FFn for reading out the stored single bit values. From the stored single bit values, the output skew of the output clock signals can then be determined. The serial bus is also used to control the phase interpolator PI so as to continually step the phase interpolator PI from 0° to 360°.

The phase locked loop generates the output clock signal based on a reference clock input to the phase locked loop. Using the phase interpolator PI, the phase shifted output clock signal PHI_out is generated by shifting the phase interpolator PI in small steps from 0-360°. The phase shifted output clock signal PHI_out has multiple phases spanning one clock period of the output clock signal. Multiple representations of the output clock signal VCO_out are generated by branching the output signal VCO_out to the outputs Out_1-Out_n via the buffers B1-Bn, respectively. The signal from the phase interpolator PI is then used as a clock to capture the data on each output Out_1-Out_n to the flip-flops FF1-FFn at the same time so that the logic state (0 or 1) of each representation of the output clock signal values is stored in response to an edge of the shifted output clock signal PHI_out. For each phase interpolator step, the output data from the VCO is captured with the phase interpolator signal being used as a clock. After capturing the output data from the VCO, the data is stored either externally on ATE equipment or in an on-chip memory from the flip-flop outputs Q1-Qn via the serial bus. Alternatively, the data storage can be performed via control logic provided on the chip. After the output data from the VCO has been stored, the serial bus controls the phase interpolator PI to move one step forward, or alternatively on-chip logic can also perform control of the phase interpolator PI.

The output data from the VCO is stored as a bit pattern, which is a result of the output skew of the circuit. For example, when there is no time delay between the output signals from each of the outputs Out_1-Out_n, the stored bit pattern is a regular pattern of 1's and 0's that correspond with each other for each output Out_1-Out_n representative of the clock signal. However, if there is a time lag (skew) between outputs, the bit patterns for each output will be shifted with respect to each other. Therefore, the output skew of the representations of the clock signal is determined by reading out the stored single bit values over the serial bus. The step count between the change in the first output Out_1 and the change in the last output Out_n multiplied by the step width of the phase interpolator is equivalent to the output skew, with the maximum resolution of this calculation being determined by the step width of the phase interpolator PI.

Although the invention has been described with reference to a particular embodiment, it is not limited to this embodiment and no doubt further alternatives will occur to the skilled person that lie within the scope of the invention as claimed.

What is claimed is:

1. An integrated electronic device for digital signal processing, comprising:
   a phase locked loop for generating an output clock signal based on a reference clock input signal;
   a stage for generating a phase shifted output clock signal having multiple phases spanning one clock period of the output clock signal and controlled to selectively shift the phase of the output clock;
   a register having multiple units, each unit having a data input coupled to receive a representation of the output clock signal and a clock input coupled to receive the phase shifted output clock signal, for storing respective single bit values in response to an edge of the shifted output clock signal; and
   circuitry for reading out the stored single bit values from the register as an indication of the output skew of the output clock signals.

2. The device of claim 1, wherein the units of the register comprise flip-flops; and wherein the circuitry for reading out the stored single bit values comprises a serial bus coupled to the outputs of the respective flip-flops.

3. The device of claim 2, further comprising buffers for generating the respective representations of the clock signal based on the output clock signal.

4. A method for determining a skew of multiple output clock signals comprising:
   generating an output clock signal based on a reference clock input signal using a phase locked loop;
   generating multiple representations of the output clock signal;
   generating a phase shifted output clock signal having multiple phases spanning one clock period of the output clock signal;
   storing the state of the value of each representation of the output clock signal in response to an edge of the shifted output clock signal; and
   reading out the stored single bit values in order to determine the output skew of the representations of the output clock signal.

* * * * *